(12) United States Patent
Nishida et al.

(10) Patent No.: US 6,552,623 B2
(45) Date of Patent: Apr. 22, 2003

(54) SELF-OSCILLATION TYPE SWITCHING POWER SUPPLY UNIT

(75) Inventors: Akio Nishida, Kyoto (JP); Ryota Tani, Nagaokakyo (JP); Koji Nakahira, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/983,386

(22) Filed: Oct. 22, 2001

(65) Prior Publication Data

US 2002/0075085 A1 Jun. 20, 2002

(30) Foreign Application Priority Data

Oct. 25, 2000 (JP) .................................. 2000-325621

(51) Int. Cl.⁷ .......................... H03B 5/24; H02M 3/338; H02M 3/335
(52) U.S. Cl. ................................. 331/111; 363/19
(58) Field of Search ............... 331/36 C, 111, 331/113 R, 113 A, 113 S; 363/18, 19, 97, 131

(56) References Cited

U.S. PATENT DOCUMENTS

| | | | | |
|---|---|---|---|---|
| 5,498,995 A | * | 3/1996 | Szepesi et al. | 327/538 |
| 5,995,382 A | * | 11/1999 | Miyazaki et al. | 363/19 |
| 6,101,103 A | * | 8/2000 | Miyazaki et al. | 363/19 |

FOREIGN PATENT DOCUMENTS

| | | |
|---|---|---|
| JP | 11215827 | 8/1999 |
| JP | 11235036 | 8/1999 |
| JP | 200278945 | 6/2000 |

* cited by examiner

*Primary Examiner*—David C. Mis
(74) *Attorney, Agent, or Firm*—Keating & Bennett, LLP (57) ABSTRACT

A switching transistor is connected to a primary winding of a transformer, an oscillation frequency control circuit is connected to a feedback winding, the oscillation frequency control circuit controls a first controlling transistor, and the first controlling transistor controls the delay time when the switching transistor is turned on. The oscillation frequency control circuit is set in a first operation mode in which the above delay does not take place at the rated load, in a second operation mode in which the oscillation frequency is controlled such that the oscillation frequency becomes constant or slowly decreases at light loading and in a third operation mode in which the oscillation frequency is further decreased while a switch is switched on.

14 Claims, 9 Drawing Sheets

WAIT MODE
(WAIT LOAD)

FIG. 7B

STANDBY MODE
(STANDBY LOAD)

FIG. 7C

NORMAL OPERATION
MODE
(RATED LOAD)

SELF-OSCILLATION TYPE SWITCHING POWER SUPPLY UNIT

BACKGROUND OF THE INVENTION

1. Field of the Invention

The present invention relates to a self-oscillation type switching power supply unit.

2. Description of the Related Art

Figure 1:
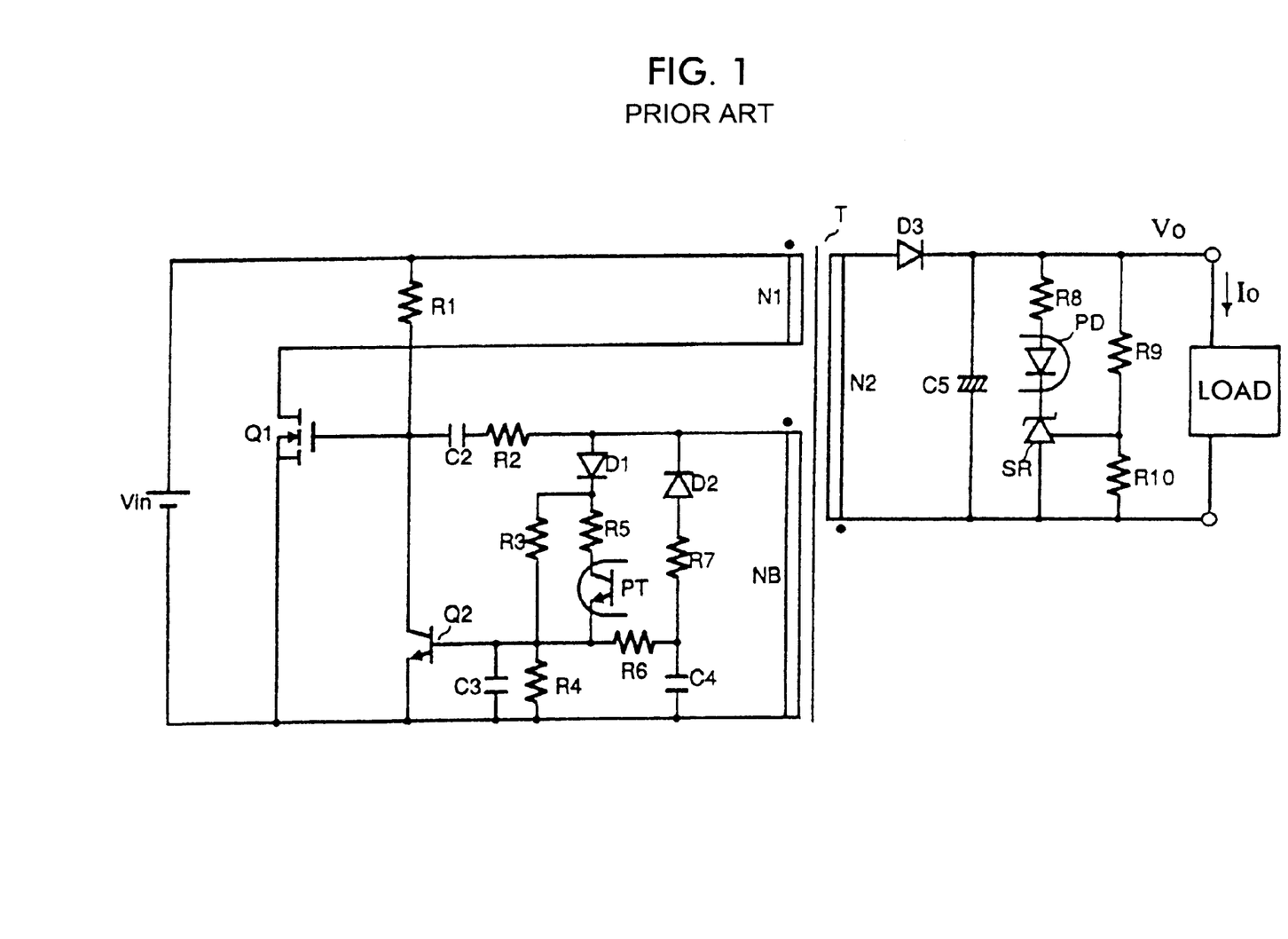
FIG. 1 is a circuit diagram of a conventional self-oscillation type switching power supply unit.

Until now, ringing choke converters have been often used as self-oscillation type switching power supply units. FIG. 1 is a circuit diagram of a conventional ringing choke converter (hereinafter referred to as RCC). As shown in the drawing, a switching transistor Q1 is connected in series to a primary winding N1 of a transformer T, and a control circuit including a phototransistor PT as a light receiving element of a photo coupler is connected to a feedback winding NB of the transformer. Furthermore, a controlling transistor Q2 is connected between the gate and source of the switching transistor Q1.

A rectifying and smoothing circuit made of a rectifying diode D3 and a smoothing capacitor C5 is provided between the two terminals of a secondary winding N2 of the transformer T. Furthermore, a voltage divider circuit comprising resistors R9 and R10, and a voltage detector circuit comprising a shunt regulator SR, a light-emitting diode PD of the photo coupler, and a resistor R8 are provided in the output portion of the rectifying and smoothing circuit.

The operation of the circuit shown in FIG. 1 is as follows. First of all, at the start when the power is turned on, a voltage is applied to the gate of the switching transistor Q1 through a starting resistor R1, and the switching transistor Q1 is turned on. Thus, an input power supply voltage is applied to the primary winding N1 of the transformer T, and a voltage having the same polarity as that of the primary winding N is generated in the feedback winding NB. This voltage signal is supplied as a positive feedback signal to the gate of the switching transistor Q1 through a resistor R2 and a capacitor C2. Because of the voltage of the feedback winding NB, a charging current flows into a capacitor C3 through a diode D1, resistors R3 and R5, and a phototransistor PT of the photocoupler. When the charged voltage of the capacitor C3 exceeds the forward voltage between the base and emitter of the controlling transistor Q2, the controlling transistor Q2 is turned on. Because of this, the voltage between the gate and source of the switching transistor Q1 becomes substantially zero and the switching transistor Q1 is forced off. At this time, a forward-bias voltage to the rectifying diode D3 is generated in the secondary winding of the transformer T, and thus the energy stored in the transformer T while the switching transistor Q1 is turned on is discharged through the secondary winding N2. Furthermore, at this time, the capacitor C3 is reverse charged by the flyback voltage of the feedback winding NB through resistors R6 and R7 and a diode D2.

When the voltage of the capacitor C3 reaches the forward-bias voltage between the base and emitter of the controlling transistor Q2 or less, the controlling transistor Q2 is turned off. When the energy stored in the transformer T is discharged through the secondary winding and the current flowing the rectifying diode D3 reaches zero, the switching transistor Q1 is turned on again by the kickback voltage generated in the feedback winding NB. Then, the above operation is repeated.

Here, the output voltage on the load side is detected by the voltage divider circuit of the resistors R9 and R10, the detected voltage is applied as a controlling voltage to the shunt regulator SR, and the amount of current flowing in the light-emitting diode PD of the photocoupler is charged in accordance with the detected voltage. Thus, the amount of light received by the phototransistor PT as a light receiving element of the photocoupler changes, and, through the change of the impedance, the charging time-constant of the capacitor C3 is changed. The more the output voltage decreases, the larger the above charging time-constant becomes, and accordingly the more the output voltage decreases, the longer the period from the turn-on of the switching transistor Q1 to the turn-off of the switching transistor Q1 by the controlling transistor Q2, that is, the ON period of the switching transistor Q1 increases, and, as a result, the output voltage is increased. In this way, constant-voltage control is performed so that the output may be held constant.

In the conventional self-oscillation type switching power supply unit of an RCC operation mode as shown in FIG. 1, it is known that the oscillation frequency f of the switching transistor Q1 changes substantially in inverse proportion to the input power or output power. This can be shown by the relationship of oscillation frequency f to output power $P_0$ as shown in FIG. 2.

Figure 2:
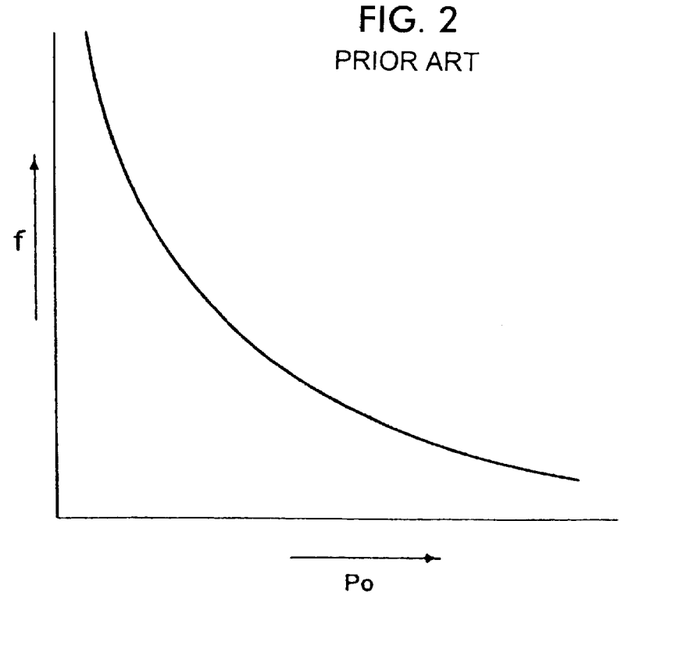
FIG. 2 shows the frequency characteristic of the conventional self-oscillation type switching power supply unit.

Generally, the lighter the load becomes, the more the switching loss per unit switching time decreases, but, as in FIG. 2, the lower the output power $P_0$, that is, the lighter the load, the higher the oscillation frequency becomes, and the higher the oscillation frequency f becomes, the more the number of occurrence of switching losses per unit time increases, and accordingly even if the load becomes lighter, the percentage of reduction in the switching losses is very little. Therefore, the lighter the load, the more the efficiency of the power supply unit decreases.

In order to reduce the switching losses at such light load, the circuit constants may be designed to decrease the oscillation frequency at the rated load, but, when it is required to cope with a very wide range from a light load to a heavy load, the oscillation frequency at light loading inevitably relatively increases. That is, generally, the oscillation frequency at the rated load is determined by factors such as the flux density of the transformer, ripple, noise, etc., and when the oscillation frequency is set to be too low, saturation of the transformer, etc., are caused.

Figure 3:
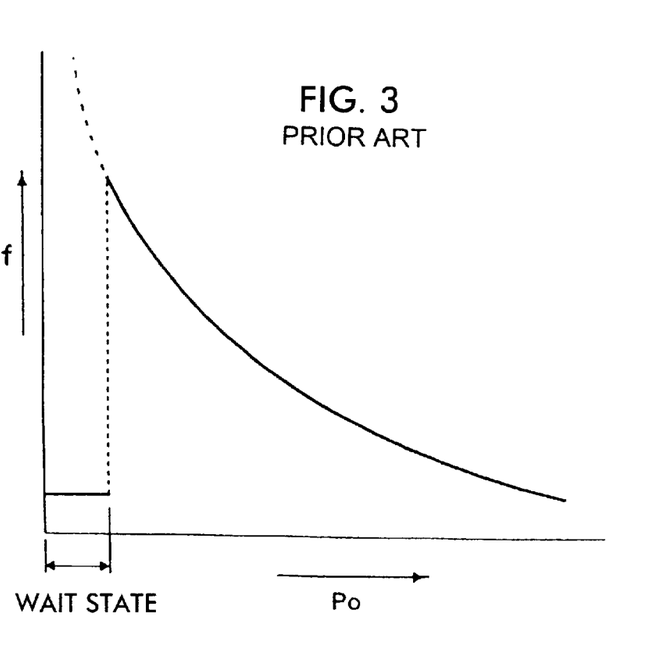
FIG. 3 shows the frequency characteristic of an improved conventional self-oscillation type switching power supply unit.
Figure 4:
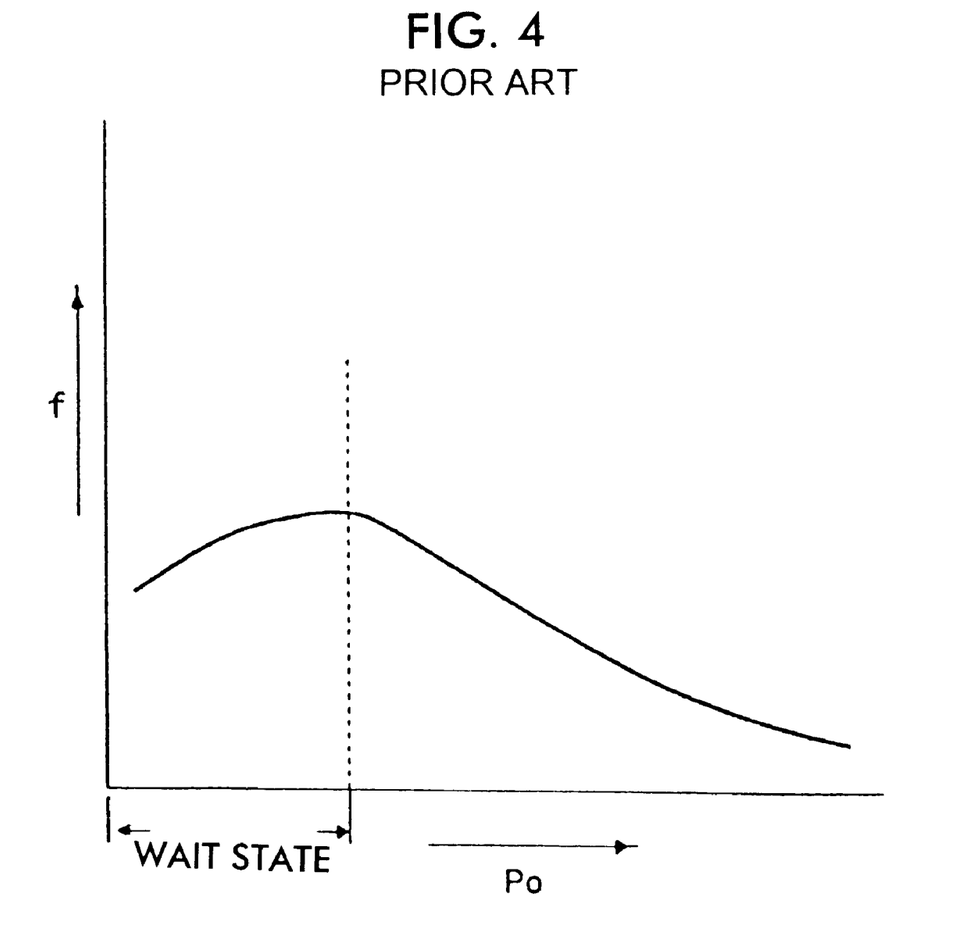
FIG. 4 shows the frequency characteristic of another improved conventional self-oscillation type switching power supply unit.

In the past, to solve the above-described problems of the self-oscillation-type switching power supply unit, in the switching power supply unit disclosed in Japanese Unexamined Patent Application Publication No. 11-235036, the loss during waiting time is improved by inputting a switching signal during waiting time thus forcing the oscillation frequency to become lower. Furthermore, in the switching power supply unit disclosed in Japanese Unexamined Patent Application Publication No. 2000-278945, the loss during waiting time is improved by continuously lowering the oscillation frequencies over the range from the frequency at the rated load to the frequency during waiting time. FIG. 3 is the frequency characteristic of the switching power supply unit disclosed in the above Japanese Unexamined Patent Application Publication No. 11-235036, and FIG. 4 is the frequency characteristic of the switching power supply unit in the above Japanese Unexamined Patent Application Publication No. 2000-278945.

However, each of the above switching power supply units has problems described below.

Case 1: Switching power supply unit in Japanese Unexamined Patent Application Publication No. 11-235036

In this switching power supply unit, the losses are improved during waiting time, but when switched to the normal operation mode, the RCC operation is performed. Because of this, the loss at light loading cannot be improved during the RCC operation, and accordingly the increased input power and the heat-production problem of the switching transistor cannot be solved. Alternatively, it is possible to provide for intermittent oscillation, and, in this case, a problem occurs in that the ripple in the output is increased. An example where the power supply unit becomes loaded lightly is the standby mode of a printer.

Case 2: Switching power supply unit in Japanese Unexamined Patent Application Publication No. 2000-278945

In this switching power supply unit, when the switching power supply unit is lightly loaded, the oscillation frequency automatically decreases, but, in this case, when the oscillation frequency is lowered too much, the response characteristics of the load become worse. Therefore, the decreasing frequency is required to be set higher than the above-described frequency during waiting time in case 1, and the improvement of the loss during waiting time is less than that in case 1.

SUMMARY OF THE INVENTION

It is an object of the present invention to prevent the degradation of response characteristics in the RCC operation and to greatly improve the efficiency during waiting time such that the oscillation frequency is controlled so as to maintain a constant oscillation frequency or slowly lower the oscillation frequency at light loading and such that the oscillation frequency can be substantially lowered by a switching signal during waiting time.

In order to solve the above-described problems, self-oscillation type switching power supply units according to the present invention are constructed as described below.

In a first aspect of the present invention, a self-oscillation type switching power supply unit comprises a transformer having a primary winding, a secondary winding, and a feedback winding; a switching transistor which self-oscillates by receiving a feedback signal from the feedback winding and which makes the current of the primary winding flow and stop; a rectifying and smoothing circuit connected to the secondary winding; and an oscillation frequency control circuit for extending an OFF period by preventing the switching transistor from turning on for a fixed period after the switching transistor has been turned off such that a control signal to be input to the switching transistor is controlled.

At the rated load exceeding a fixed current, the oscillation frequency control circuit is set in a first operation mode in which a normal ringing choke converter operation mode is performed to lower the oscillation frequency as the load becomes heavier; at light loading in which the load current is a fixed current or less, the oscillation frequency control circuit is set in a second operation mode in which the OFF period is extended so that the oscillation frequency may be constant or slowly decrease as the load current is reduced; and the oscillation frequency control circuit contains a switch and is set in a third operation mode in which, when the switch is in a fixed state, the oscillation frequency is lowered further than in the second operation mode.

In the present invention, at the rated load exceeding a fixed load current, the oscillation frequency control circuit is set in a normal operation mode (first operation mode), that is, in a normal RCC operation mode, and, at a light load, in which the load current is a fixed current or less, the oscillation frequency control circuit is set in a standby mode (second operation mode), in which the OFF period is extended such that the oscillation frequency becomes constant or slowly reduced as the load current decreases. Furthermore, by a switching signal of the switch, the oscillation frequency control circuit can be set in a wait mode (third operation mode) such that the oscillation frequency is more reduced than in the standby mode. In this way, the RCC operation is performed in a normal operation mode, the oscillation frequency is controlled to be constant or slowly decrease in a standby mode, and the oscillation frequency can be controlled to further decrease by the switch in a wait mode. Therefore, since the oscillation frequency is not decreased too much in a standby mode, the response characteristics of the load are prevented from worsening, and since the oscillation frequency is greatly decreased in the wait mode, the loss can be prevented from increasing. For example, when this switching power supply unit is applied to printers, it is possible to set the switching power supply unit in a normal operation mode when the printer does printing, in a standby mode when the printer is powered on and is ready for printing, and in a wait mode when the printer is powered off, and accordingly, while reliability is maintained, power consumption for the entire printer can be lowered.

In the present invention, the oscillation frequency control circuit comprises a capacitor which is charged while the switching transistor is turned on and is discharged while the switching transistor is turned off, a first controlling transistor for preventing the switching transistor from turning on until the voltage of the capacitor reaches a fixed voltage when the capacitor is discharged, and a second controlling transistor for keeping the first controlling transistor turned off while the switching transistor is turned on; and the switch keeps the fixed voltage lower in the fixed state.

When the switch is set in a fixed state (for example, in the ON state), the operation of the first controlling transistor for prohibiting the turn-on of the switching transistor is made longer. Thus, since the period in which the turn-on of the switching transistor is prohibited is made longer, the oscillation frequency is reduced. That is, in the wait mode (third operation mode), the oscillation frequency decreases.

In the present invention, the oscillation frequency control circuit comprises a capacitor which is charged while the switching transistor is turned on and is discharged while the switching transistor is turned off, a first controlling transistor for preventing the switching transistor from turning on until the voltage of the capacitor reaches a fixed voltage when the capacitor is discharged, a second controlling transistor for keeping the first controlling transistor turned off while the switching transistor is turned on, and a discharge circuit in which the capacitor is discharged by applying the charged voltage of the capacitor to the control terminal of the switching transistor; the switch being provided in the discharge circuit; and the amount of the discharged current is decreased in a fixed state.

Here, the discharge circuit in which the charged voltage of the first capacitor is applied to the control terminal of the switching transistor is provided, and the amount of this discharge current is made changeable. Also, in such a construction, when the switch is in a fixed state, that is, in a wait mode, the ON period of the first controlling transistor is made longer, and accordingly the oscillation frequency is decreased.

In the present invention, the switch is switched on and off by an external signal.

Preferably, the switching means is made to be switched on and off by an external signal. Therefore, when a normal operation mode (first operation mode), a standby mode (second operation mode), and a wait mode (third operation mode) can be detected in an external circuit, these modes are possible to be automatically set.

In the present invention, a load detector for detecting light and heavy loading, and a switching circuit for switching the switch are provided such that the oscillation frequency control circuit is set in a third operation mode after a fixed period when the load detector has detected light loading.

Here, even if the load changes from a normal operation mode (first operation mode) to a wait mode (third operation mode), the oscillation frequency control circuit is not immediately shifted to the wait mode (third operation mode), and the oscillation frequency control circuit is changed into the wait mode (third operation mode) in a fixed period. In this way, even if the load often quickly changes, since the oscillation frequency control circuit operates in the normal operation mode (first operation mode) for the period, the reliability does not deteriorate. On the other hand, the wait mode (third operation mode) can be immediately shifted to the normal operation mode (first operation mode).

DETAILED DESCRIPTION OF EMBODIMENTS OF THE INVENTION

Figure 5:
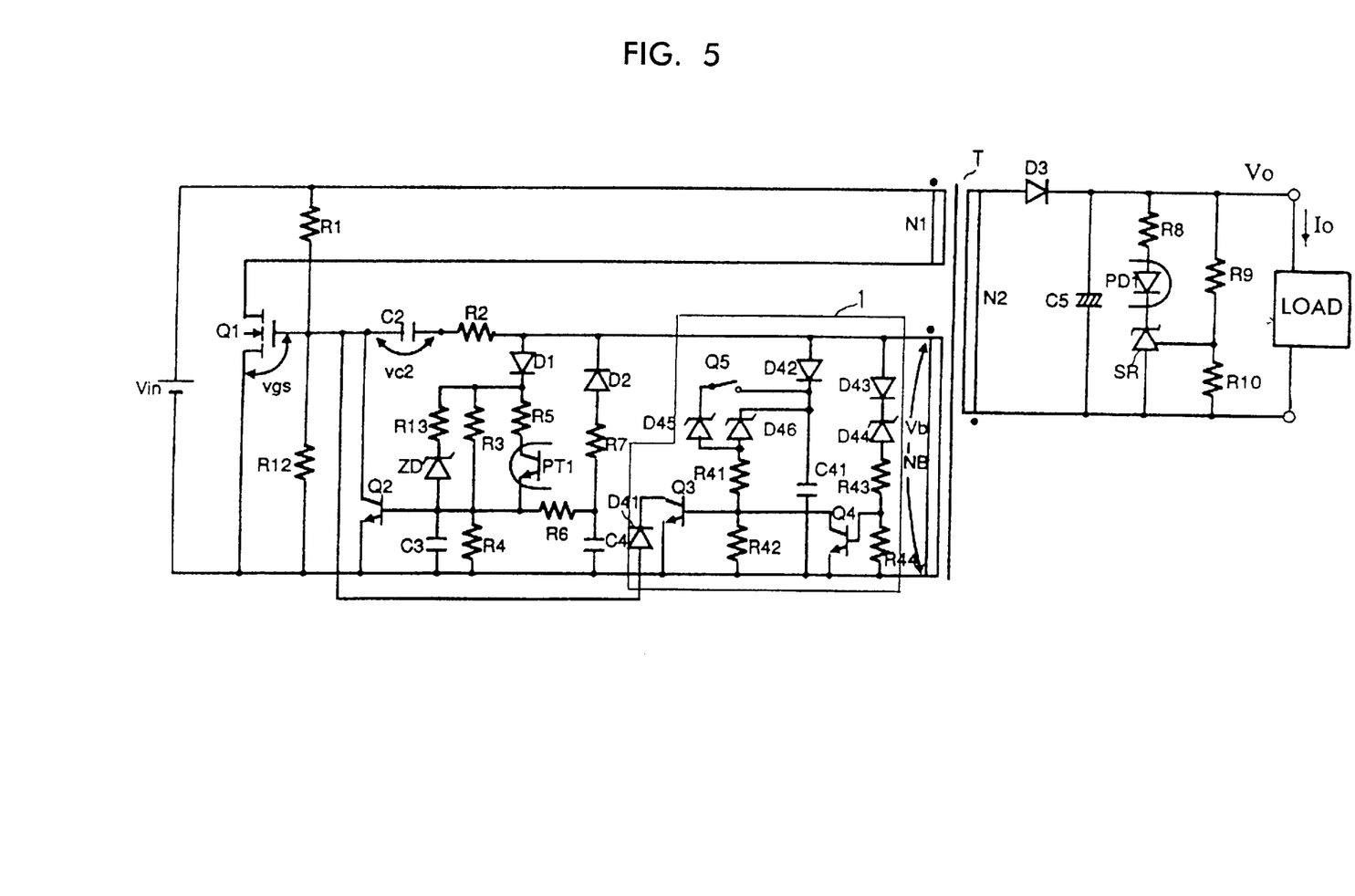
FIG. 5 is a circuit diagram of a self-oscillation type switching power supply unit according to a first embodiment of the present invention.

FIG. 5 is a circuit diagram of a self-oscillation type switching power supply unit according to a first embodiment of the present invention.

A switching transistor Q1, e.g., a MOS-FET, is connected in series to a primary winding N1 of a transformer T, and a feedback winding NB of the transformer T constitutes a feedback circuit to the switching transistor Q1. A rectifying and smoothing circuit comprising a rectifying diode D3 and a smoothing capacitor C5 is provided in a secondary winding N2 of the transformer T. Furthermore, in the output portion of the rectifying and smoothing circuit, a voltage divider circuit of resistors R9 and R10 and a voltage detector circuit comprising a shunt regulator SR, a light-emitting element PD1 of a first photo coupler, and a resistor R8 are provided.

The difference between the circuit of the present embodiment shown in FIG. 5 and the conventional circuit shown in FIG. 1 is that an oscillation frequency control circuit 1 is provided in the circuit in FIG. 5.

In the oscillation frequency control circuit 1, there are provided a capacitor C41 which is charged by the voltage Vb of the feedback winding NB while the switching transistor Q1 is turned on, a first controlling transistor Q3 for preventing the switching transistor Q1 from turning on when the charged voltage of the capacitor C41 is a fixed voltage or higher, and a second controlling transistor Q4 for turning on the switching transistor Q1 when the voltage Vb of the feedback winding NB is generated. The capacitor C41 is charged by the voltage Vb of the feedback winding NB through a diode D42, this charged voltage is divided by a Zener diode D46, a resistor R41, and a resistor R42, and the voltage across the resistor R42 is applied to the control terminal of the first controlling transistor Q3. Furthermore, the voltage Vb of the feedback winding NB is divided by a series circuit of a diode D43, a Zener diode D44, a resistor R43, and a resistor R44, the divided voltage across the resistor R44 is applied to the second controlling transistor Q4, and the first controlling transistor Q3 is turned off right after the voltage Vb has been generated. Furthermore, a series circuit of a Zener diode D45 and a switch Q5 is connected in parallel to the Zener diode D46. As described later, in the standby mode, this switch Q5 is turned to the ON state, and the Zener voltage of the Zener diode D46 is larger than that of the Zener diode D45.

In the switching power supply unit of the present embodiment, the value of each of the resistors, diodes, etc., is determined such that the oscillation frequency control circuit 1 functions as described below when the switch Q5 is in the OFF state.

That is, at the rated load, when the current flowing in the diode D3 in the rectifying and smoothing circuit becomes zero and the voltage Vb of the feedback winding NB is generated, the voltage across the resistor R42 has already been reduced such that the first controlling transistor Q3 is turned off. Because of this, the switching transistor Q1 is controlled by the first controlling transistor Q3 so that the switching transistor Q1 may function without delay. Furthermore, at light loading where the load current is a fixed level or less, when the current flowing the diode D3 becomes zero and the voltage Vb of the feedback winding NB is generated, the voltage across the resistor R42 exists such that the first controlling transistor Q3 is continuously turned on. However, this first controlling transistor Q3 is not in the ON-state for a long time, and, as a result, the switching transistor Q1 is turned on with a slight delay. Thus, at light loading, control is maintained such that the oscillation frequency is substantially constant or slowly decreases.

On the other hand, when the switch Q5 is switched on, because the Zener diode D45 is connected in parallel to the Zener diode D46 and the Zener voltage decreases, the voltage across the resistor R42 increases, and the switching transistor Q1 is delayed longer by the controlling transistor Q3. In this way, at light loading when the switch Q5 is switched on, the oscillation frequency is greatly decreased and the switching loss can be reduced.

In the above operation, at the rated load in which the load current exceeds a fixed value, the oscillation frequency control circuit 1 is set in a normal operation mode (first operation mode) in which an OFF period of the switching transistor Q1 is not extended by the first controlling transistor Q3; at light loading in which the load current is a fixed value or less, the oscillation frequency control circuit 1 is set in a standby mode (second operation mode) in which the OFF period is extended such that the oscillation frequency becomes constant or is slowly reduced as the load current decreases; and when the switch Q5 is turned on, the oscillation frequency control circuit 1 is set in a wait mode (third operation mode) such that the oscillation frequency is reduced more than in the standby mode. Thus, the self-oscillation type switching power supply unit in FIG. 5 shows a frequency characteristic as in FIG. 6. In the drawing, area A shows the normal operation mode, area B shows the standby mode, and area C shows the wait mode. Characteristic a for comparison shows the case in which no countermeasure has been taken, and characteristic b shows a conventional switching power supply unit shown in Japanese Patent Application No. 11-09468.

Figure 7A:
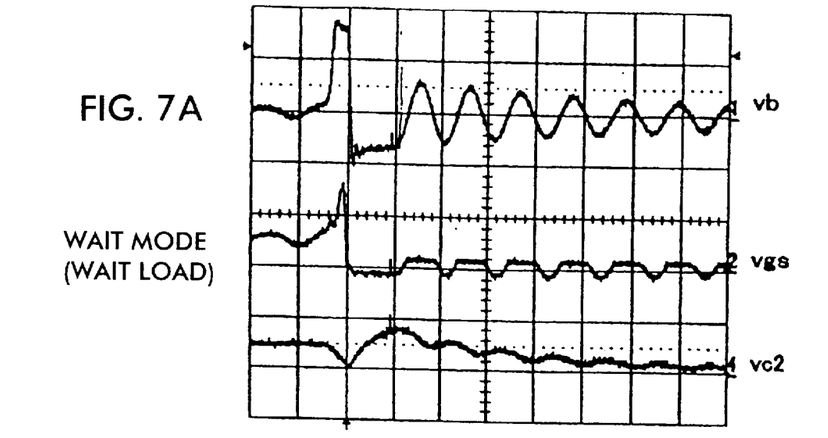
FIGS. 7A to 7C show the waveforms of the essential parts of the self-oscillation type switching power supply unit according to the first embodiment of the present invention.
Figure 7B:
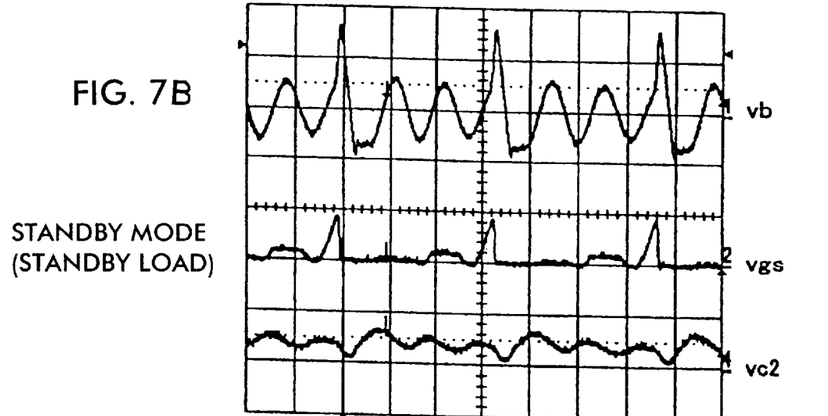
Figure 7C:
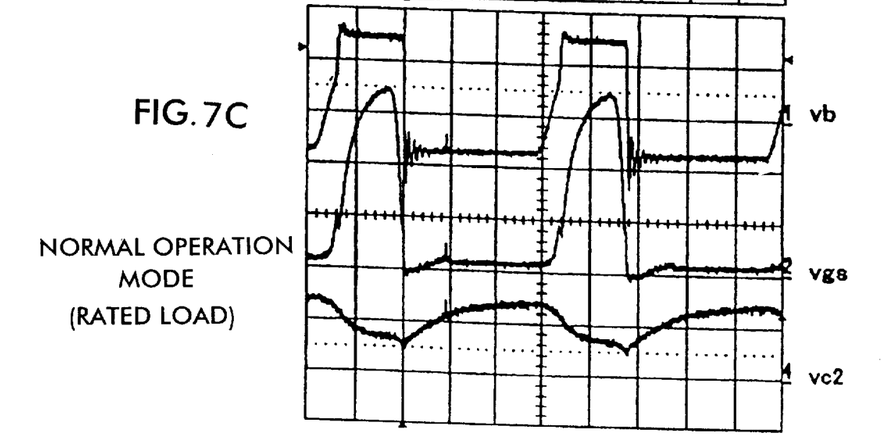

Furthermore, the essential waveforms in each of the normal operation mode, the standby mode, and the wait mode are shown in FIGS. 7A to 7C. In these drawings, the output voltage Vb of the feedback winding NB, the voltage vgs between the gate and source of the switching transistor Q1, and the voltage vc2 across the capacitor C2 connected between the gate of the first switching transistor Q1 and the feedback winding NB are shown. As shown in FIG. 7C, an RCC operation takes place in the normal operation mode, and there is no quiescent time in the period from immediately after the load current has become zero until the switching transistor Q1 is turned on. In the standby mode in FIG. 7B, since a little quiescent time exists, the oscillation frequency is reduced to a certain level. In the wait mode in FIG. 7A, since the quiescent time is set to be fairly quite long, the oscillation frequency is greatly reduced.

Figure 8:
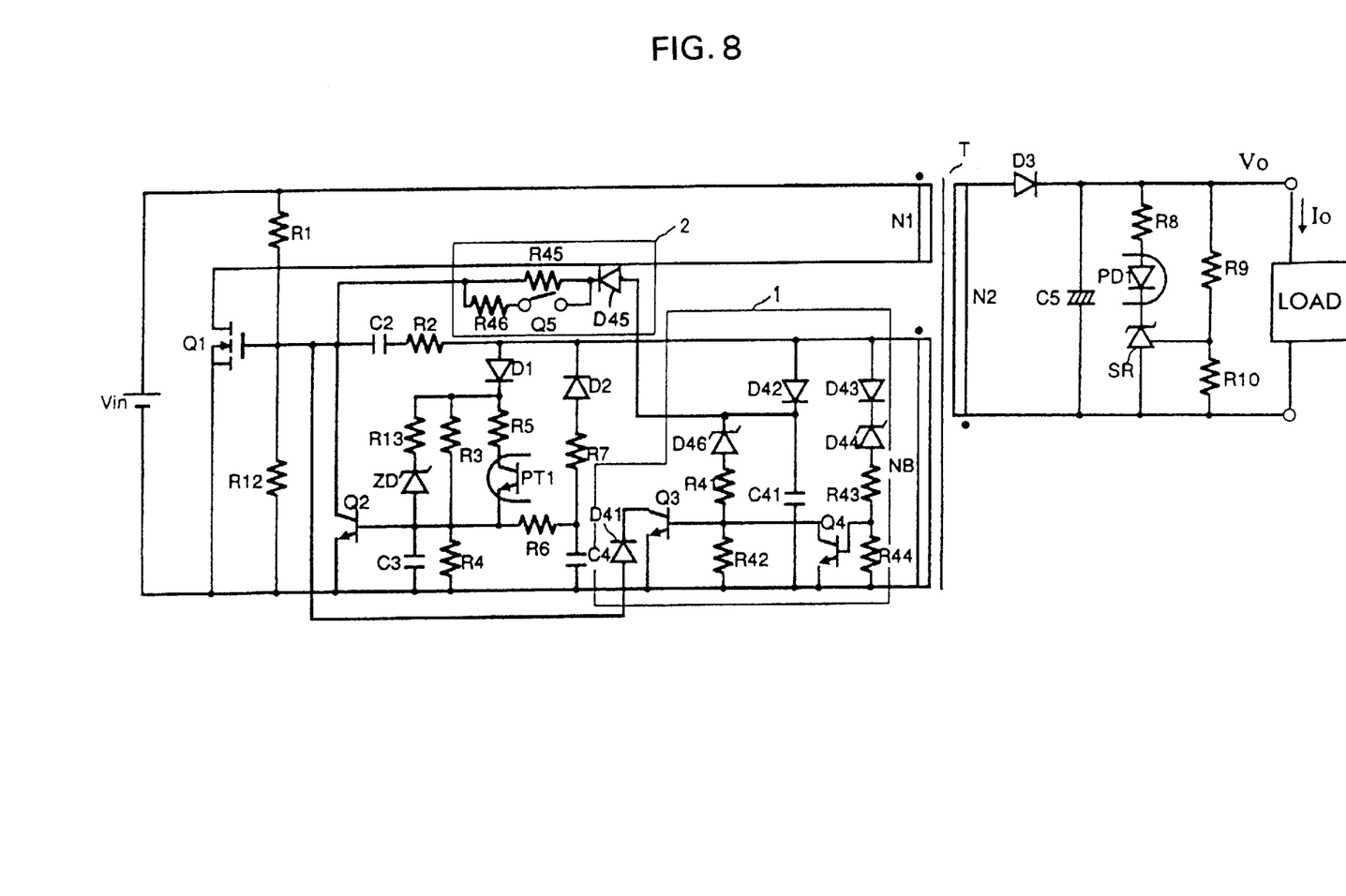
FIG. 8 is a circuit diagram of a self-oscillation type switching power supply unit according to a second embodiment of the present invention.

FIG. 8 shows a circuit diagram of a self-oscillation type switching power supply unit according to a second embodiment of the present invention. This switching power supply unit is different from the switching power supply unit shown in FIG. 5 in that, instead of the Zener diode D45 and the switch Q5, a discharge circuit 2 is provided so that the capacitor C41 is discharged by applying the charged voltage of the capacitor C41 to the gate of the switching transistor Q1. In the discharge circuit 2, a resistor R45 is connected in series to the diode D45, and a series circuit of a resistor R46 and the switch Q5 is connected in parallel to the resistor R45.

Figure 6:
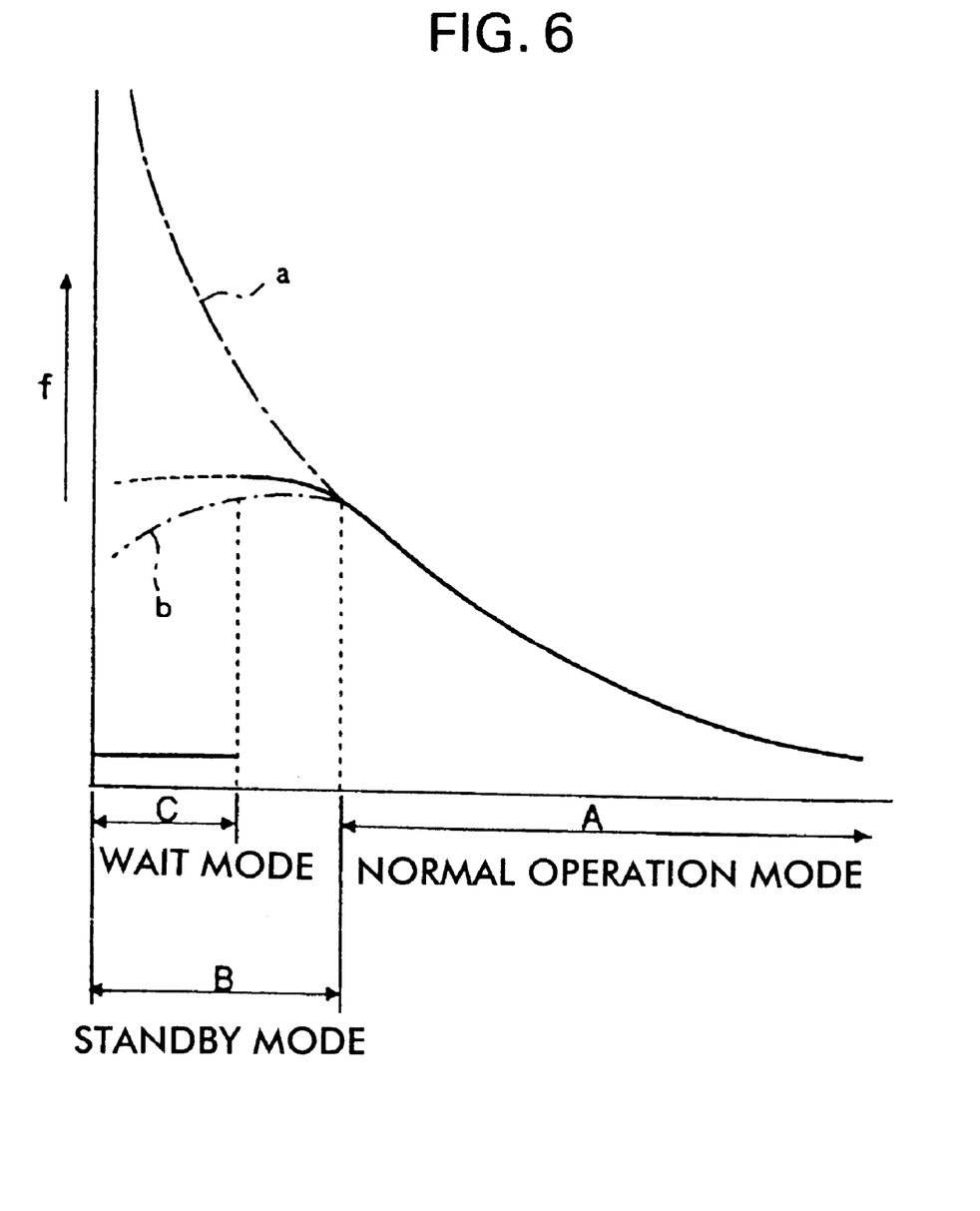
FIG. 6 shows the frequency characteristic of the self-oscillation type switching power supply unit according to the first embodiment of the present invention.

In the above circuit, while the switch Q5 is turned on, the amount of current discharged from the capacitor C41 increases. Therefore, at the rated load, because the first controlling transistor Q3 is turned off before the current flowing in the diode D3 becomes zero, the switching transistor Q1 is turned on without delay. Furthermore, at light loading, because the first controlling transistor Q3 is in the ON state even after the current flowing in the diode D3 has become zero, the turn-on of the switching transistor Q1 is slightly delayed. Accordingly, when the switch Q5 is switched on, the normal operation mode is set at the rated load, and the standby mode is set at a light load. Furthermore, because the amount of current discharged from the capacitor C41 decreases when the switch Q5 is switched off, the first controlling transistor Q3 continues to be turned on even after the current flowing in the diode D3 has become zero. Therefore, the above delay time becomes longer compared with that when the switch Q5 is turned on, and the switching frequency decreases. In the self-oscillation type switching power supply unit according to the present embodiment, the frequency characteristic is as shown in FIG. 6, and the waveforms are the same as those shown in FIGS. 7A to 7C.

Moreover, because the electric charge of the capacitor C41 is supplied to the capacitor C2 during the delay time determined by the oscillation frequency control circuit 1, the attenuation factor of the voltage difference between the terminals of the capacitor C2 when the switching transistor Q1 is turned on and turned off decreases. Therefore, since the switching transistor Q1 is tuned on without fail even if the delay time becomes very long, the delay time can be set at an arbitrary length.

Figure 9:
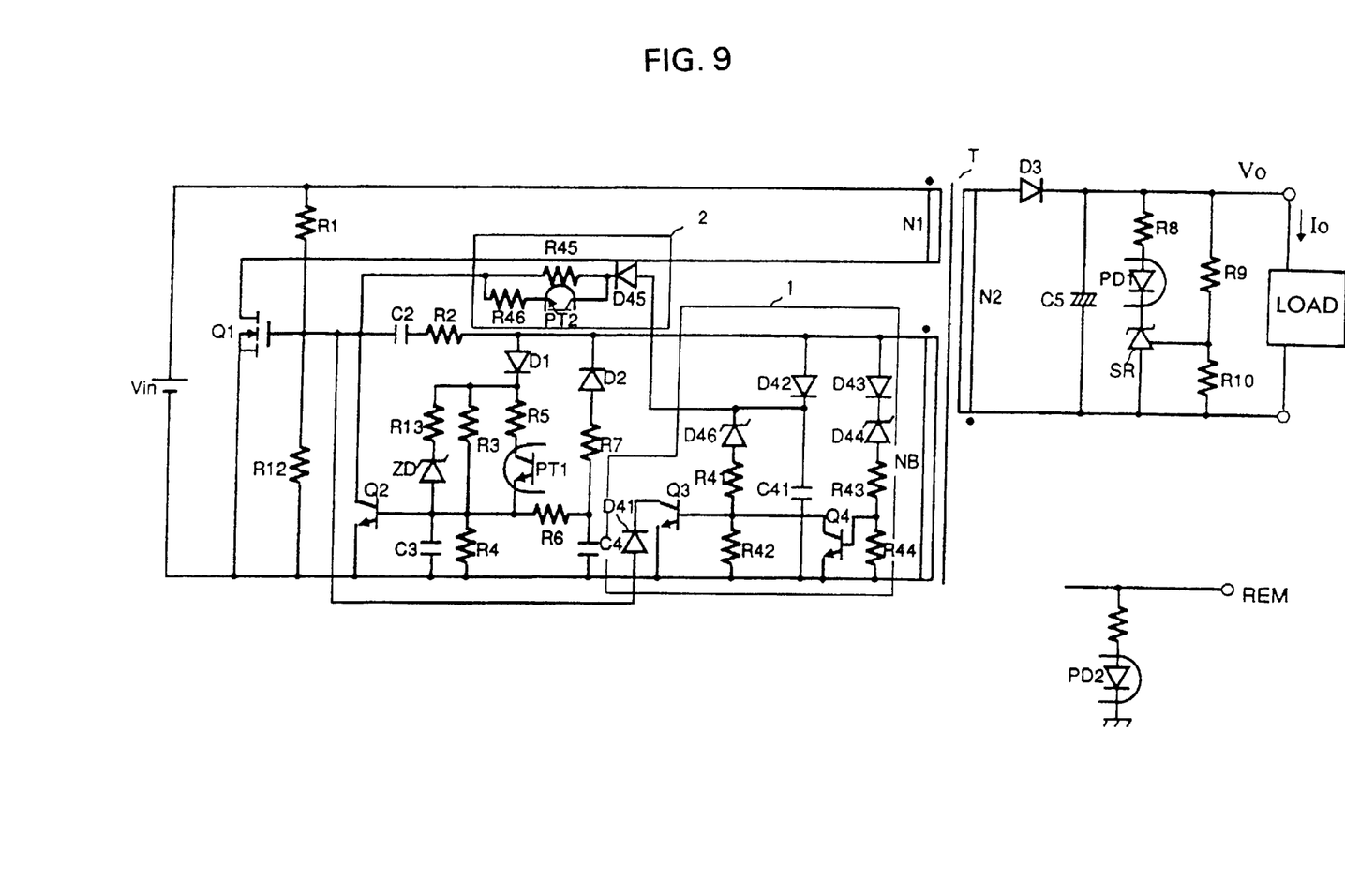
FIG. 9 is a circuit diagram of a self-oscillation type switching power supply unit according to a third embodiment of the present invention.

FIG. 9 is a circuit diagram of a self-oscillation type switching power supply unit according to a third embodiment of the present invention.

The self-oscillation type switching power supply unit is different from the self-oscillation type switching power supply unit shown in FIG. 8 in that the switch Q5 in FIG. 8 is replaced with a phototransistor PT2 of a photocoupler and that the light-emitting photodiode PD2 of the photocoupler is connected to an external remote signal input terminal REM.

In such a construction, the phototransistor PT2 can be turned on by only inputting a remote signal into the remote signal input terminal REM. Accordingly, when constructed such that a HIGH signal is input to the remote signal input terminal REM in the normal operation mode and the standby mode and a LOW signal is input to the remote signal input terminal REM in the wait mode, it is easy to set the operation mode.

Figure 10:
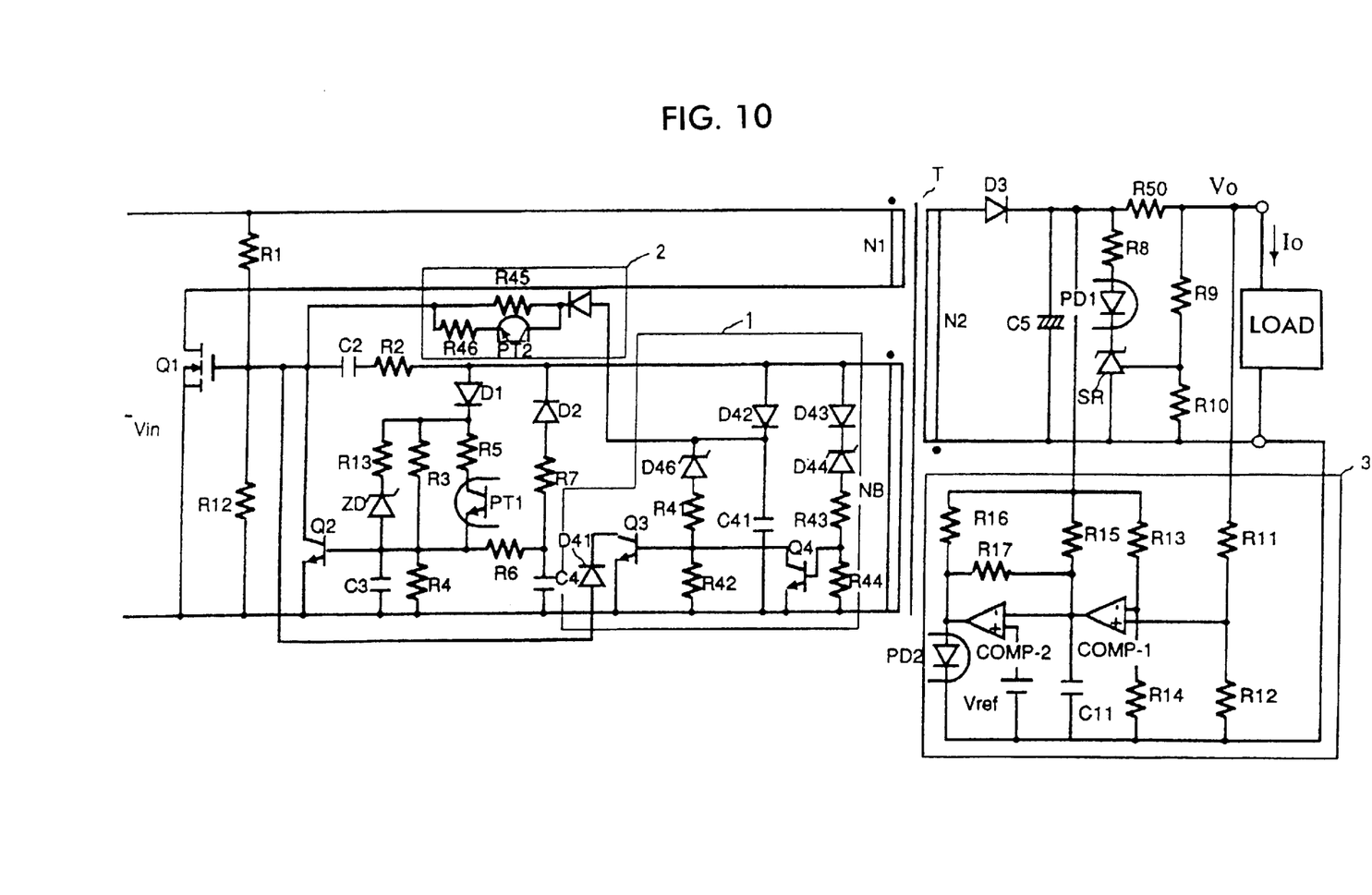
FIG. 10 is a circuit diagram of a self-oscillation type switching power supply unit according to a fourth embodiment of the present invention.

FIG. 10 shows a circuit diagram of a self-oscillation type switching power supply unit according to a fourth embodiment of the present invention.

The self-oscillation type switching power supply unit is different from the self-oscillation type switching power supply unit shown in FIG. 9 in that a resistor R50 for detecting light or heavy loading and a switching circuit 3 for controlling the turn-on and turn-off of the phototransistor PT2 based on the voltage across the resistor R50 are provided.

Two comparators COMP-1 and COMP-2 are provided in the switching circuit 3. The comparator COMP-1 detects the voltage across the resistor R50 and the rated load or light loading. In the case of the rated load, since the voltage across the resistor R50 is large, the output of the comparator COMP-1 is grounded. Furthermore, in the case of light loading, the output of the comparator COMP-1 is made open. The comparator COMP-2 compares the reference voltage Vref and the charged voltage of the capacitor C11, and turns off the photodiode PD2 when the charged voltage of the capacitor C11 exceeds the reference voltage Vref. When the photodiode PD2 is turned off, the phototransistor PT2 is turned off and the self-oscillation type switching power supply unit enters the wait mode. That is, the above switch switching circuit 3 operates as in the following.

Case 1: Normal operation mode to wait mode

When the output current decreases, the output of the comparator COMP-1 is made open and the voltage of a capacitor C11 in an RC time-constant circuit made of a resistor R15 and the capacitor C11 starts to increase. When the voltage exceeds the reference voltage Vref, the output of the comparator COMP-2 becomes LOW and the photodiode PD2 is turned off to change the switching power supply unit to the wait mode.

Case 2: Wait mode to normal operation mode

When the output current increases at heavy loading, the output of the comparator COMP-1 is grounded and the voltage of the capacitor C11 in the above RC time-constant circuit immediately decreases. When the voltage becomes the reference voltage Vref or less, the output of the comparator COMP-2 becomes HIGH and the photodiode PD2 is tuned on to change the switching power supply unit to the normal operation mode.

Based on the above operation, even if the rated load changes to light loading, the modes are not changed during a period determined by the time constant of the above RC time-constant circuit. Furthermore, when light loading changes to the rated load, the wait mode is immediately changed to the normal operating mode. Therefore, when the loading frequently changes, the switching power supply unit is always operated in the normal operation mode and the response is good. Furthermore, because the wait mode is immediately changed to the normal operation mode, a response problem is not caused.

According to the present invention, by controlling the oscillation frequency such that, at light loading, the oscillation frequency is constant or slowly decreases, the increase of the frequency is prevented at light loading, and the efficiency and the ripple of the output can be improved at light loading in the RCC and also can be greatly improved by the switch.

Furthermore, the mode can be automatically changed by utilizing the switching circuit, and the mode is controlled to change into the third operation mode after the passage of a fixed amount of time when light loading has been detected, and accordingly the switching power supply unit is operated in the normal operation mode when the load often quickly changes and the responsivity can be prevented from deteriorating.

Although the present invention has been described in relation to particular embodiments thereof, many other variations and modifications and other uses will become apparent to those skilled in the art. Therefore, the present invention should be limited not by the specific disclosure herein, but only by the appended claims.

What is claimed is:

1. A self-oscillation type switching power supply unit comprising:

a transformer having a primary winding, a secondary winding, and a feedback winding;

a switching transistor which self-oscillates by receiving a feedback signal from the feedback winding and which switches flow of current in the primary winding between an OFF period and an ON period;

a rectifying and smoothing circuit connected to the secondary winding; and an oscillation frequency control circuit for extending an OFF period of the switching transistor by preventing the switching transistor from turning on for a predetermined period after the switching transistor has been turned off such that a control signal to be input to the switching transistor is controlled;

wherein, at a rated load exceeding a predetermined current, the oscillation frequency control circuit is set in a first operation mode in which a normal ringing choke converter operation is performed to lower the oscillation frequency as the loading becomes heavier;

wherein, at light loading in which the load current is the predetermined current or less, the oscillation frequency control circuit is set in a second operation mode in which the OFF period is extended so that the oscillation frequency is constant or slowly decreases as the load current is reduced; and wherein the oscillation frequency control circuit includes a switch for setting in a third operation mode in which, when the switch is in a fixed state, the oscillation frequency is lowered further than in the second operation mode.

2. The self-oscillation type switching power supply unit of claim 1, wherein the oscillation frequency control circuit comprises a capacitor which is charged while the switching transistor is turned on and is discharged while the switching transistor is turned off, a first controlling transistor for preventing the switching transistor from turning on until the voltage of the capacitor reaches a predetermined voltage at which time the capacitor is discharged, and a second controlling transistor for keeping the first controlling transistor turned off while the switching transistor is turned on, and wherein, the switch maintains the predetermined voltage of the capacitor lower during the fixed state.

3. The self-oscillation type switching power supply unit of claim 2, wherein, when the switch is turned on, said capacitor begins to discharge at a lower predetermined voltage.

4. The self-oscillation type switching power supply unit of claim 3, further comprising a first Zener diode coupled in a discharge path of the capacitor, and further comprising a second Zener diode coupled in series with the switch, the second Zener diode having a lower Zener voltage and said switch and second Zener diode being coupled in parallel with the first Zener diode.

5. The self-oscillation type switching power supply unit of claim 1, wherein the oscillation frequency control circuit comprises a capacitor which is charged while the switching transistor is turned on and is discharged while the switching transistor is turned off, a first controlling transistor for preventing the switching transistor from turning on until the voltage of the capacitor reaches a fixed voltage at which time the capacitor is discharged, a second controlling transistor for keeping the first controlling transistor turned off while the switching transistor is turned on, and a discharge circuit in which the capacitor is discharged by applying the charged voltage of the capacitor to the control terminal of the switching transistor, wherein, the switch is provided in the discharge circuit, and wherein an amount of discharged current from the capacitor is decreased when the switch is in the fixed state.

6. The self-oscillation type switching power supply unit of claim 5, wherein the discharge circuit comprises a first resistance coupled in series with a diode to said capacitor and a second resistance coupled in series with the switch, the switch and second resistance being coupled in parallel to the first resistance.

7. The self-oscillation type switching power supply unit of claim 6, wherein the fixed state is when the switch is open.

8. The self-oscillation type switching power supply unit of claim 1, wherein the switch is switched on and off by an external signal.

9. The self-oscillation type switching power supply unit of claim 1, further comprising:

a load detector for detecting the magnitude of the load and a switching circuit for switching the switch such that the oscillation frequency control circuit is set in the third operation mode after a predetermined period when the load detector has detected light loading.

10. The self-oscillation type switching power supply unit of claim 8, wherein the external signal controls the switch via a photo coupler.

11. The self-oscillation type switching power supply unit of claim 9, wherein the load detector is coupled to a photo coupler for controlling the switch.

12. The self-oscillation type switching power supply unit of claim 9, wherein the load detector comprises first and second comparators, the first comparator detecting whether output current is light or at rated load and the second comparator determining whether to cause said switch to enter the fixed state and the third operation mode to be set.

13. The self-oscillation type switching power supply unit of claim 12, wherein the second comparator includes a delay circuit whereby the third operation mode is entered from the first operation mode after a time delay.

14. The self-oscillation type switching power supply unit of clam 13, wherein the second comparator responds so that the third operation mode changes to the first operation mode substantially without delay.

* * * * *